United States Patent
Hsu (10) Patent No.: US 6,982,221 B1
(45) Date of Patent: Jan. 3, 2006

(54) METHOD OF FORMING 2/3F PITCH HIGH DENSITY LINE ARRAY

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/149,884

(22) Filed: Jun. 10, 2005

(51) Int. Cl.
H01L 21/4763 (2006.01)
H01L 21/20 (2006.01)

(52) U.S. Cl. .................. 438/618; 438/584; 438/587; 438/666; 438/668

(58) Field of Classification Search .............. 438/584, 438/587, 666, 668
See application file for complete search history.

(56) References Cited

U.S. PATENT DOCUMENTS 6,110,837 A * 8/2000 Linliu et al. ............ 438/723
6,156,485 A * 12/2000 Tang et al. ............ 430/313
6,399,286 B1 * 6/2002 Liu et al. ............ 430/316

* cited by examiner

Primary Examiner—Matthew Smith
Assistant Examiner—Nicholas J. Tobergte
(74) Attorney, Agent, or Firm—David C. Ripma; Joseph P. Curtin (57) ABSTRACT

A method of forming a ⅔F pitch high density line array, where F is the minimum line width of a photolithographic process used to accomplish the method of the invention; includes depositing a conductive material on a wafer; depositing a layer of sacrificial material; etching the sacrificial material to form a placeholder having width and space of F; depositing sidewall spacer material hard mask to a thickness of about ⅓F on the sacrificial material; anisotropically etching the hard mask material; depositing a layer of silicon oxide and smoothing the silicon oxide; selectively removing the placeholder; depositing a second sidewall spacer layer to a thickness of about ⅓F; depositing and smoothing another hard mask layer; etching the silicon oxide and conductive material using the other hard mask lines as a pattern; etching to form interconnect lines; and selectively etching any remaining hard mask material to expose lines and contact pads.

9 Claims, 8 Drawing Sheets

METHOD OF FORMING 2/3F PITCH HIGH DENSITY LINE ARRAY

FIELD OF THE INVENTION

This invention relates to sub-lithography line/space, and specifically to a technique for forming contact lines having a width less than that of the minimum line separation of a photolithography process.

BACKGROUND OF THE INVENTION

The conventional smallest line and space between lines are limited by the limitation of a lithographic tool. The minimum line width and that of line separation is "F". This invention provides a method to produce ⅓F line width and line space.

SUMMARY OF THE INVENTION

A method of forming ⅔F pitch high density line array, where F is the minimum line width of a photolithographic process used to accomplish the method of the invention; includes preparing a wafer; depositing a conductive material on the wafer to function as contact pads and electrodes; depositing a layer of sacrificial material on the conductive material taken from the group of material consisting of those material which are selectively etchable with respect to silicon oxide and the conductive material; applying and patterning a layer of photoresist on the sacrificial material; etching the sacrificial material to form a placeholder having width and space of F; depositing sidewall spacer material hard mask, taken from the group of material consisting of SiN and TiN, to a thickness of about ⅓F on the sacrificial material; applying and patterning a layer of photoresist on the hard mask; anisotropically etching the hard mask material; depositing a layer of silicon oxide and smoothing the silicon oxide by CMP; selectively removing the placeholder; depositing a second sidewall spacer layer to a thickness of about ⅓F; depositing another hard mask layer and smoothing the other hard mask layer by CMP; etching the silicon oxide and conductive material using the other hard mask lines as a pattern; applying and patterning a layer of photoresist; etching to form interconnect lines; and selectively etching any remaining hard mask material to expose lines and contact pads. The sacrificial material may be polysilicon, copper or aluminum, which is deposited to a thickness of between about 300 nm to 800 nm.

It is an object of the invention to decrease the minimum line/space density by a factor of three.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The method of the invention for fabricating ⅓F, where "F" is the minimum line width of any given lithography tool, requires only conventional IC fabrication equipment. The fabrication steps of the method of the invention may be carried out using conventional processes. It is the combination and the order of completing the steps of the method of the invention which leads to the ⅓F line width results of the invention. The steps of the method of the invention are shown generally at 10 in FIG. 1.

Figure 1:
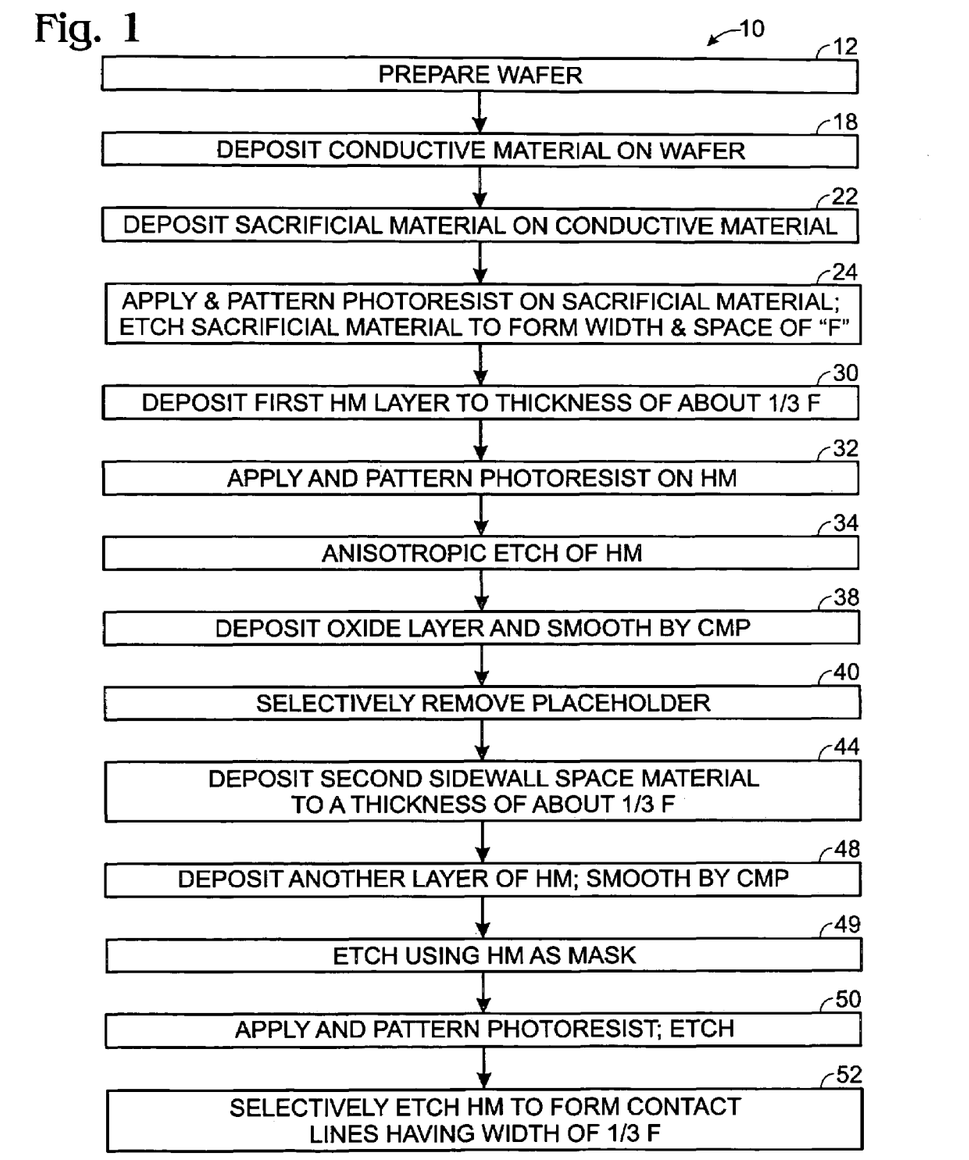
FIG. 1 is a block diagram of the method of the invention.
Figure 2:
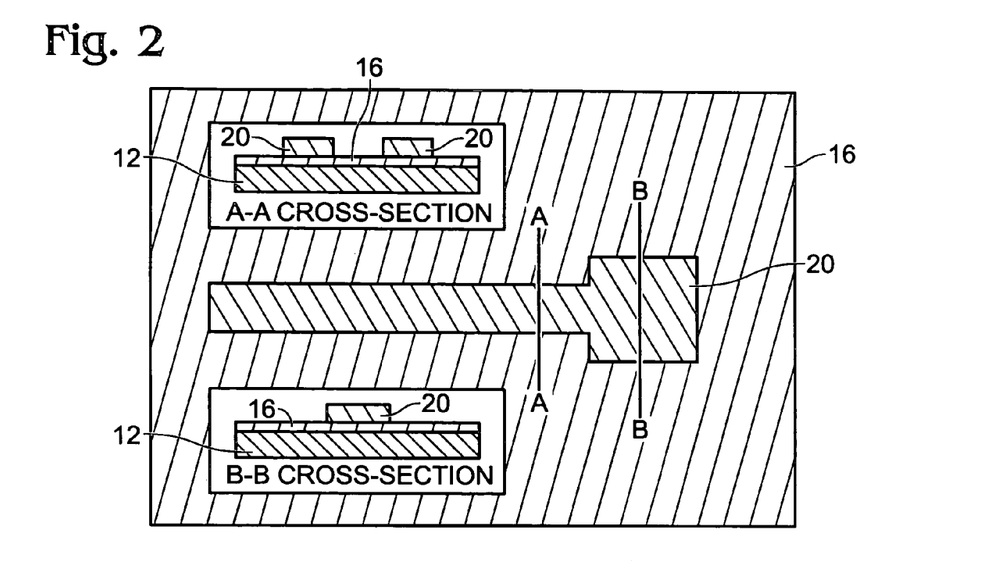
FIGS. 2–7 depict steps in a first embodiment of the method of the invention.

Referring now to FIGS. 1 and 2, a wafer 12 is prepared, which may be a conventional silicon wafer. Conductive material 16 is deposited 18, from which a very narrow line array will be fabricated. The conductive material is referred to herein as an "electrode".

Between about 300 nm to 800 nm of a sacrificial material 20 is deposited 22 on the electrode. The sacrificial material may be polysilicon, aluminum, or any other material which may be selectively etched with respect to silicon oxide and the electrode material, which are well known to those of ordinary skill in the art. Photoresist is applied and patterned, and the sacrificial material is etched, 24. The line width and space is equal to F, which is the resolution limit of the given lithography tool. This etched line is referred to herein as a placeholder, which is formed of sacrificial material 20, and is depicted in FIG. 2. Three lines, and their respective contact pads, will be formed using placeholder 20. The cross-sections along lines A—A and B—B are shown as inserts to FIG. 2 et seq. to illustrate the line array.

Figure 3:
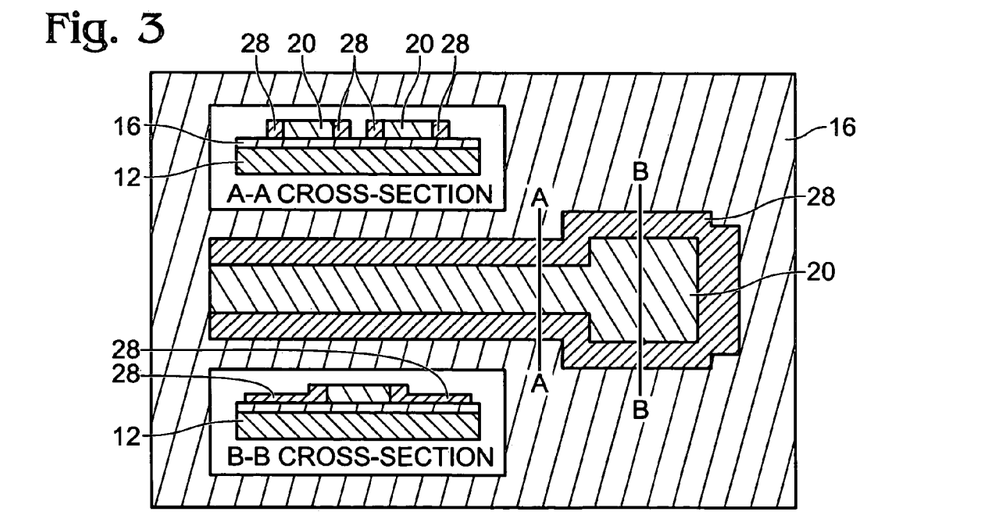

Referring to FIG. 3, a first sidewall spacer material 28, such as silicon nitride or titanium nitride (TiN), is deposited. The material of this layer is referred to herein as a hard mask, or "HM." The thickness of the nitride layer at the sidewall of the placeholder is about ⅓ that of the line space of the placeholders. The sidewall should have good step coverage to provide a fairly straight and uniform thickness on the sidewall of the placeholder. Photoresist is applied and patterned to mask the contact pad areas, 32. An anisotropic etch is applied 34 to HM 28 to form HM sidewalls, as is depicted in FIG. 3.

Figure 4:
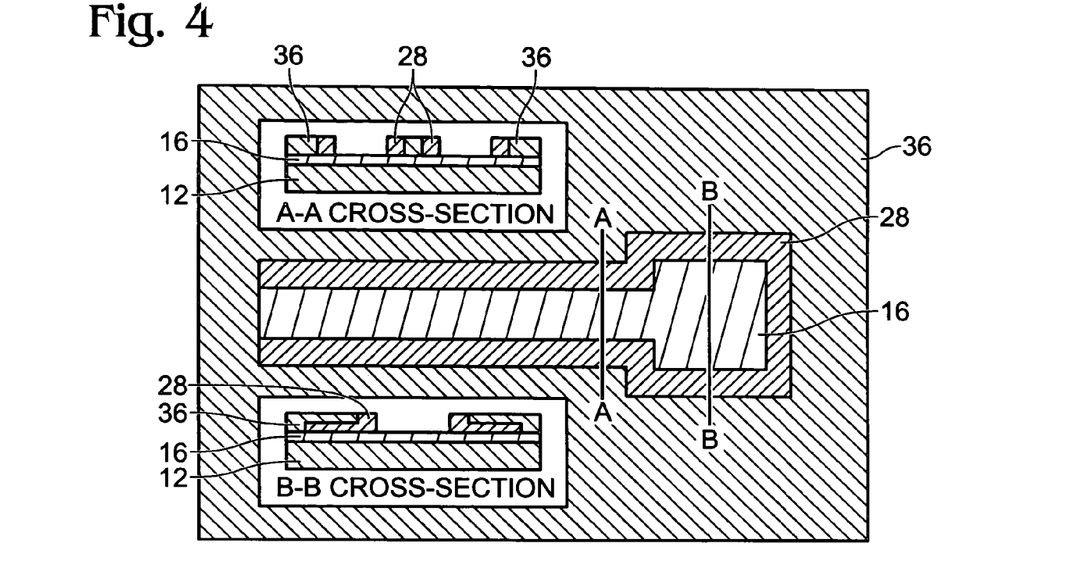

A layer of silicon oxide 36 is deposited and smoothed by CMP 38, stopping at the level of the placeholder layer. The oxide thickness is at least 50% thicker than that of the placeholder. The placeholder is then selectively removed 40, resulting in the structure depicted in FIG. 4.

Figure 5:
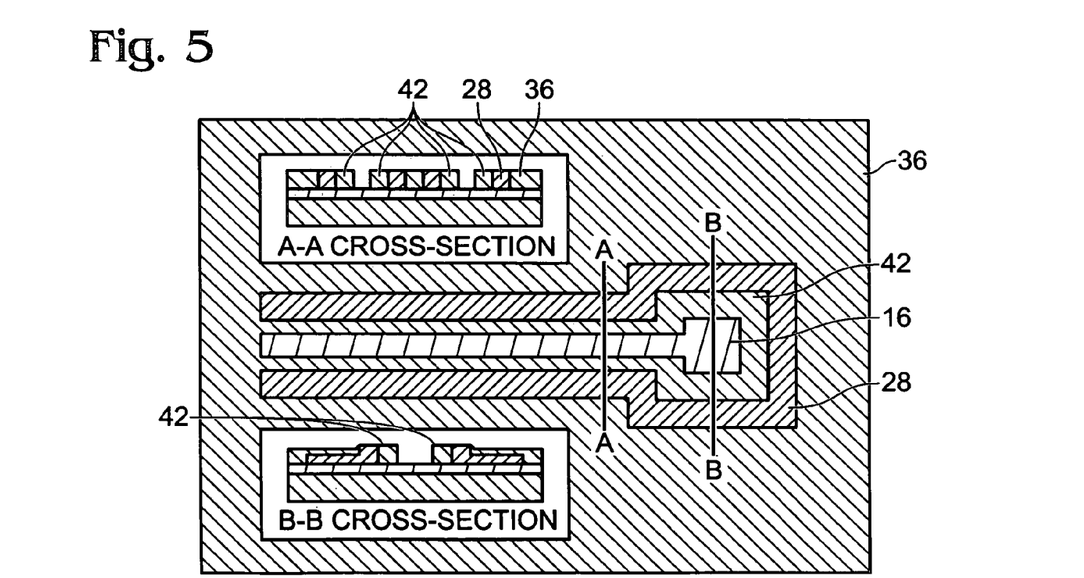

A second sidewall spacer material 42, such as silicon oxide, is deposited, 44. The thickness of this oxide layer is such that it results in a sidewall oxide having a thickness of about ⅓ that of the line width of the placeholder. Again, the sidewall material must be deposited to have good step coverage to provide a straight and uniform thickness on the sidewall of the placeholder. The oxide is etched to form the requisite sidewall oxide, as depicted in FIG. 5.

Figure 6:
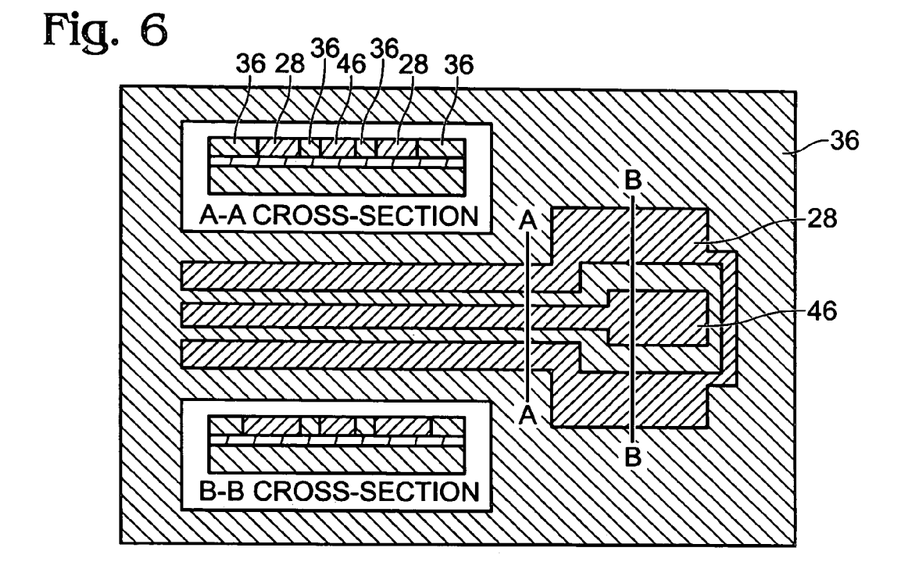
Figure 7:
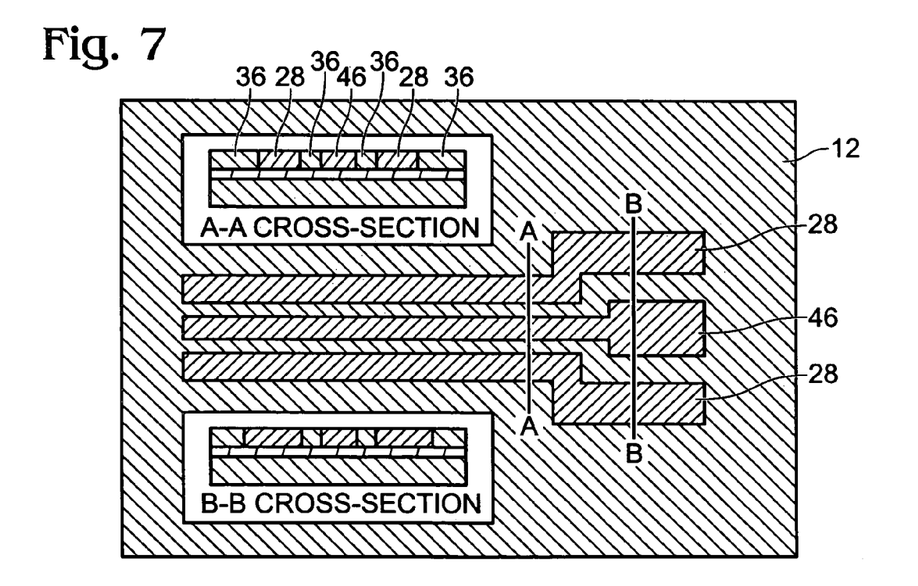
Figure 8:
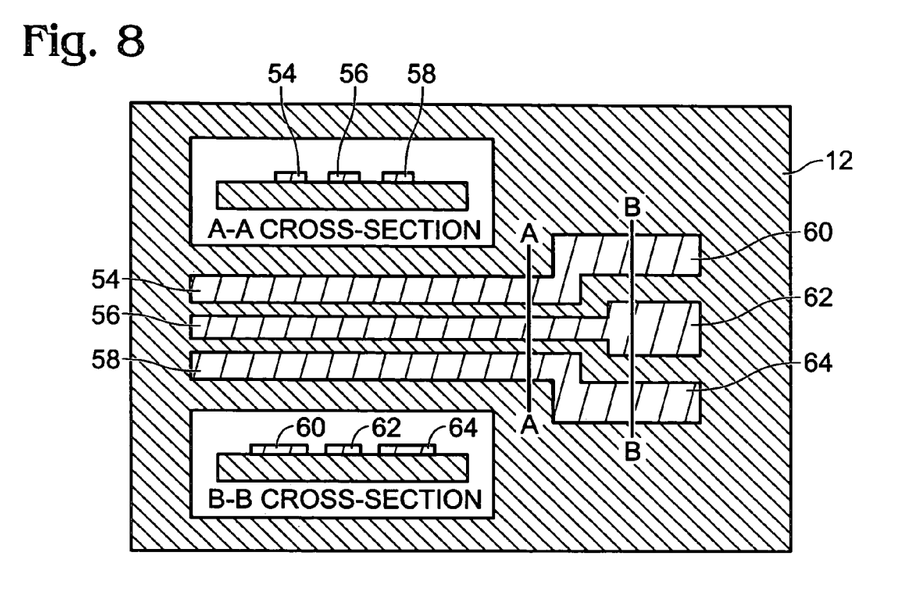
FIGS. 8–15 depict steps in a second embodiment of the method of the invention.
Figure 9:
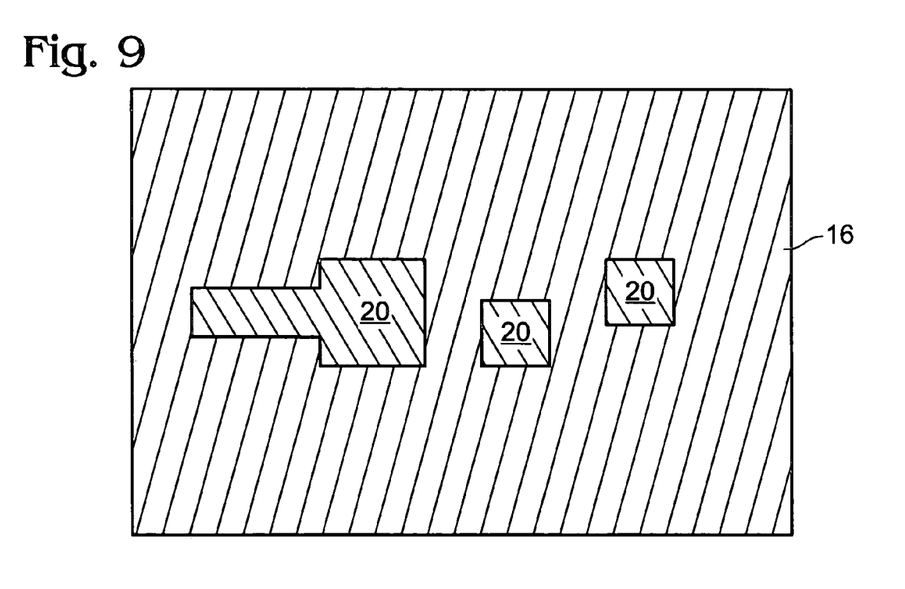
Figure 10:
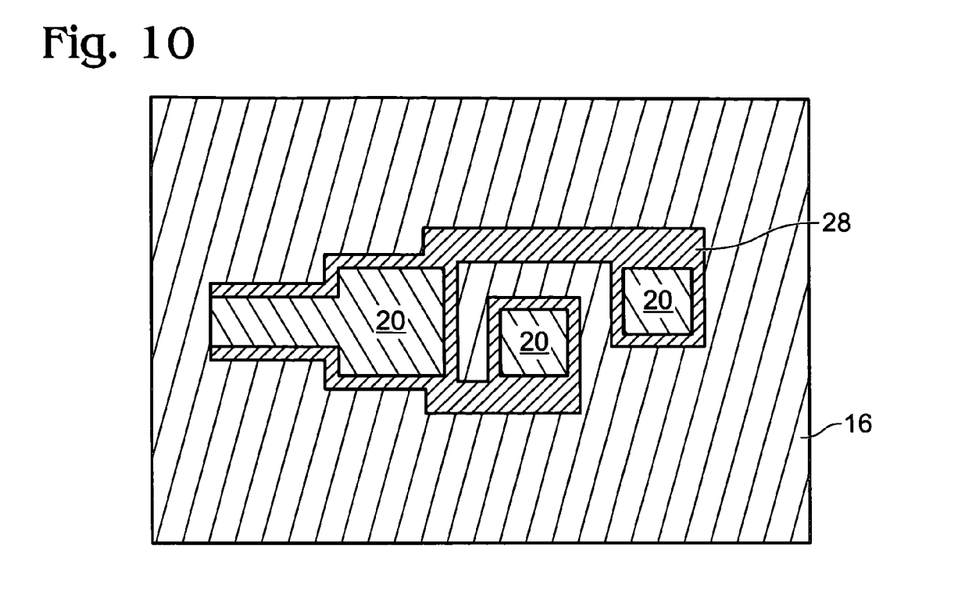
Figure 11:
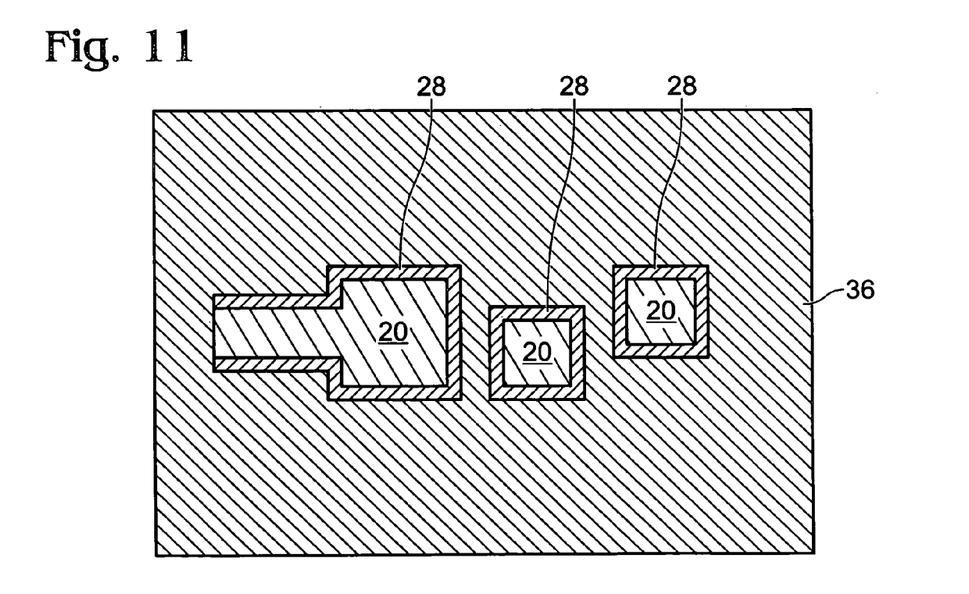
Figure 12:
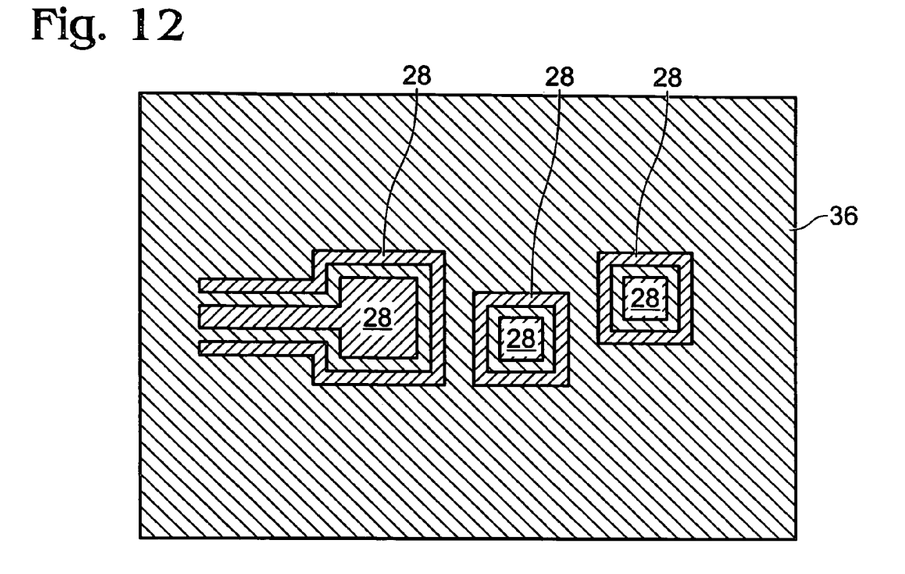

Another layer of HM 46 is deposited and smoothed by CMP 48. The remaining oxide and the electrode are etched using the other HM lines as a mask 49, as depicted in FIG. 6. Photoresist is applied and patterned, and the interconnect lines of the three contact pads are etched 50, as shown in FIG. 7. Finally, a selective etch of HM 52 results in the final lines 54, 56, 58, and their respective contact pads 60, 62, 64, as depicted in FIG. 8.

Figure 13:
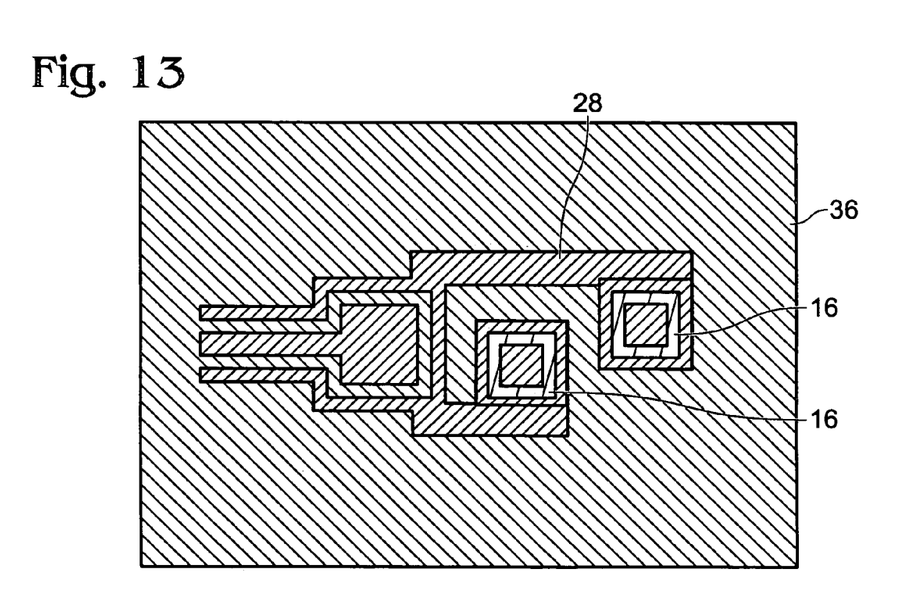
Figure 14:
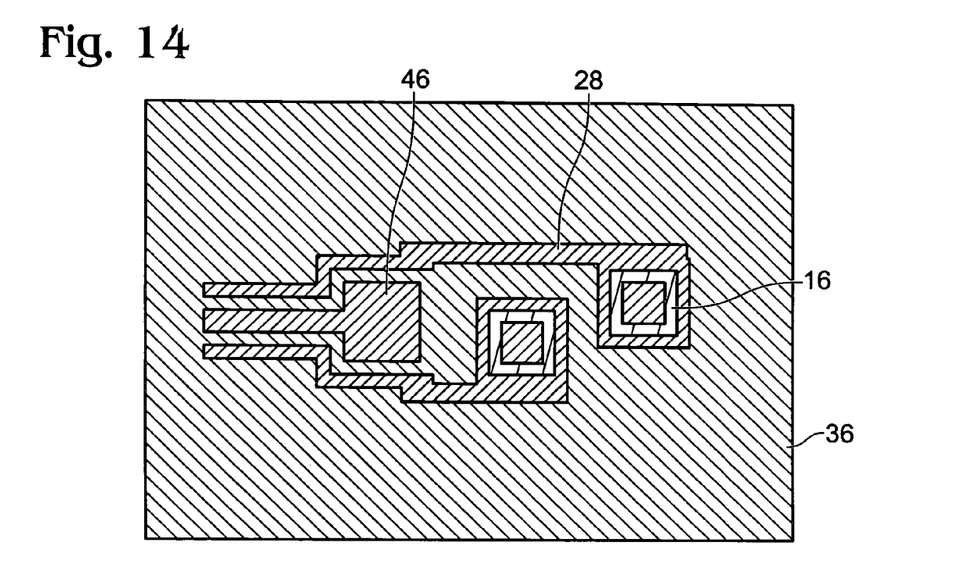
Figure 15:
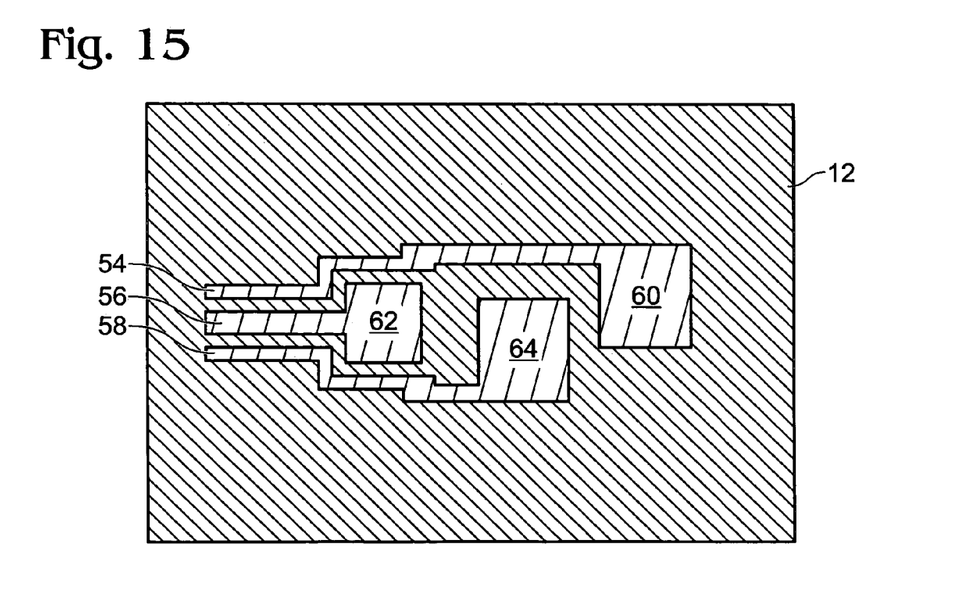

An alternative method of the invention includes placing the contact pads in line with the line array. In this arrangement, there is more room for the contact pads when the contact pads of each set of the three lines are placed at the alternative side of the array. This is shown in FIGS. 9–12, which correspond to FIGS. 2–5, respectively. Following selective etch of the oxide and mask to protect the contact pad areas and etching of the electrode, the structure is depicted in FIG. 13, which corresponds to FIG. 6. FIGS. 14 and 15 correspond to FIGS. 7 and 8, respectively.

Thus, method of forming a ⅔F pitch high density line array has been disclosed. It will be appreciated that further variations and modifications thereof may be made within the scope of the invention as defined in the appended claims.

I claim:

1. A method of forming a ⅔F pitch high density line array, where F is the minimum line width of a photolithographic process used to accomplish the method of the invention; comprising:
   preparing a wafer;
   depositing a conductive material on the wafer to function as contact pads and electrodes;
   depositing a layer of sacrificial material on the conductive material;
   applying and patterning a layer of photoresist on the sacrificial material;
   etching the sacrificial material to form a placeholder having width and space of F;
   depositing sidewall spacer material hard mask to a thickness of about ⅓F on the placeholder;
   applying and patterning a layer of photoresist on the hard mask;
   anisotropically etching the hard mask material;
   depositing a layer of silicon oxide and smoothing the silicon oxide by CMP;
   selectively removing the placeholder;
   depositing a second sidewall spacer layer to a thickness of about ⅓F;
   depositing another hard mask layer and smoothing the other hard mask layer by CMP;
   etching the silicon oxide and conductive material using the other hard mask lines as a pattern;
   applying and patterning a layer of photoresist;
   etching to form interconnect lines and contact pads; and
   selectively etching any remaining hard mask material to expose lines and contact pads.

2. The method of claim 1 wherein said depositing a layer of sacrificial material includes depositing a layer of material taken from the group of material consisting of polysilicon, copper and aluminum.

3. The method of claim 1 wherein said depositing a layer of sacrificial material includes depositing a layer of material taken from the group of material consisting of those material which are selectively etchable with respect to silicon oxide and the conductive material.

4. The method of claim 1 wherein said depositing a layer of sacrificial material includes depositing a layer of sacrificial material to a thickness of between about 300 nm to 800 nm.

5. The method of claim 1 wherein said depositing sidewall spacer material hard mask includes depositing sidewall spacer material hard mask taken from the group of material consisting of SiN and TiN.

6. A method of forming ⅔F pitch high density line array, where F is the minimum line width of a photolithographic process used to accomplish the method of the invention; comprising:
   preparing a wafer;
   depositing a conductive material on the wafer to function as contact pads and electrodes;
   depositing a layer of sacrificial material on the conductive material taken from the group of material consisting of those material which are selectively etchable with respect to silicon oxide and the conductive material;
   applying and patterning a layer of photoresist on the sacrificial material;
   etching the sacrificial material to form a placeholder having width and space of F;
   depositing sidewall spacer material hard mask to a thickness of about ⅓F;
   applying and patterning a layer of photoresist on the hard mask;
   anisotropically etching the hard mask material;
   depositing a layer of silicon oxide and smoothing the silicon oxide by CMP;
   selectively removing the placeholder;
   depositing a second sidewall spacer layer to a thickness of about ⅓F on the placeholder;
   depositing another hard mask layer and smoothing the other hard mask layer by CMP;
   etching the silicon oxide and conductive material using the other hard mask lines as a pattern;
   applying and patterning a layer of photoresist;
   etching to form interconnect lines and contact pads; and
   selectively etching any remaining hard mask material to expose lines and contact pads.

7. The method of claim 6 wherein said depositing a layer of sacrificial material includes depositing a layer of material taken from the group of material consisting of polysilicon, copper and aluminum.

8. The method of claim 6 wherein said depositing a layer of sacrificial material includes depositing a layer of sacrificial material to a thickness of between about 300 nm to 800 nm.

9. The method of claim 6 wherein said depositing sidewall spacer material hard mask includes depositing sidewall spacer material hard mask taken from the group of material consisting of SiN and TiN.

* * * * *